(12) United States Patent
Wendell

(10) Patent No.: US 7,075,840 B1
(45) Date of Patent: Jul. 11, 2006

(54) LOW IMPEDANCE MEMORY BITLINE ELIMINATING PRECHARGE

(75) Inventor: Dennis Wendell, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 59 days.

(21) Appl. No.: 10/779,327

(22) Filed: Feb. 13, 2004

(51) Int. Cl.
*G11C 7/00* (2006.01)

(52) U.S. Cl. .................. 365/203; 365/189.09; 365/190

(58) Field of Classification Search ................ 365/203, 365/189.09, 190, 202, 148
See application file for complete search history.

(56) References Cited

U.S. PATENT DOCUMENTS

| | | | | |
|---|---|---|---|---|
| 5,007,023 | A | 4/1991 | Kim et al. | 365/203 |
| 5,544,105 | A * | 8/1996 | Hirose et al. | 365/203 |
| 5,563,831 | A | 10/1996 | Ting | 365/189.09 |
| 5,848,015 | A | 12/1998 | Seno | 365/203 |
| 5,875,139 | A | 2/1999 | Semi | 365/203 |
| 5,883,845 | A | 3/1999 | Khang | 365/203 |
| 5,963,494 | A | 10/1999 | Khang | 365/203 |
| 6,643,804 | B1 | 11/2003 | Aipperspach et al. | 714/718 |
| 6,667,921 | B1 | 12/2003 | Park | 365/203 |
| 6,801,463 | B1 * | 10/2004 | Khellah et al. | 365/203 |

OTHER PUBLICATIONS

Bhutani, S., et al., "Processor Having a Coalescing Cache Disable Mode," U.S. Appl. No. 10/766,745, filed Jan. 27, 2004.

Heald, R., et al., "A Third-Generation SPARC V9 64-b Microprocessor," IEEE JSSC, Nov. 2000, pp. 1526-1538.
Konstadinidis, G., et al., "Implementation of a Third-Generation 1.1GHz 64b Microprocessor," 2002 IEEE International Solid-State Circuits Conference, Session 20/Microprocessors/20.3.
Konstadinidis, G., et al., "Implementation of a Third-Generation 1.1GHz 64b Microprocessor," 2002 IEEE Journal of Solid-State Circuits, vol. 37, No. 11, Nov. 2002, pp. 1461-1469.
McCarroll, B., et al., "A High-Speed CMOS Comparator for Use in an ADC," IEEE JSSC, Feb. 1988, pp. 159-165.
Wendell, D., et al., "A 4 MB On-Chip L2 Cache for a 90nm 1.6GHz 64 bit Microprocessor," IEEE JSSC, Feb. 2004.

* cited by examiner

*Primary Examiner*—David Lam
(74) *Attorney, Agent, or Firm*—Hamilton & Terrile, LLP; Gary W. Hamilton

(57) ABSTRACT

A memory system using low impedance memory bitlines that eliminate the need for a precharge clock signal. An equilibration circuit controlled by a reference voltage is connected to the first and second bitlines of a memory cell and is operable to maintain a predetermined equilibrium condition between the first and second bit lines. The equilibration circuit is operable to generate an impedance load in the first and second bit lines at a level that allows generation of differential signals in the bit lines. The memory cell bitlines can move from a sensed state "low" to the opposite state "high" without an intervening precharge, thereby providing a significant increase in performance.

21 Claims, 5 Drawing Sheets

LOW IMPEDANCE MEMORY BITLINE ELIMINATING PRECHARGE

BACKGROUND OF THE INVENTION

1. Field of the Invention

The present invention relates to the field of digital computer systems and, more particularly, to the field of memory systems used in digital computer systems.

2. Description of the Related Art

Modern microprocessors use a broad range of memory systems for processing and storage of data. Over the years, technical advances have significantly increased the capacity of digital memories and also the speed with which the memories can transfer data. In current digital processing systems, various types of semiconductor memories are used. One of the most common types of semiconductor memory is random access memory (RAM). While the various types of semiconductor memories are available in different design formats, the structure, organization and access of information in these memory structures is essentially the same. In random access memory, information can be stored in a flip-flop type circuit, or simply as a charge on capacitors.

RAM is generally organized within the system into addressable blocks, each containing a predetermined number of memory cells. Each memory cell within a RAM represents a bit of information. The memory cells are organized into rows and columns. Each row of memory cells forms a word. Each memory cell within a row is coupled to the same wordline which is used to activate the memory cells within the row. The memory cells within each column of a block of memory are coupled to a pair of bitlines which are used to read data from the activated memory cell or write data to the activated memory cell. The pair of bitlines includes a bitline and an inverse (complement) bitline. A memory cell is therefore accessed by activating the appropriate wordline and pair of bitlines.

Generally, before a memory access operation is performed to or from a memory cell within a block of memory, the pairs of bitlines within that block of memory are all precharged to a specified voltage level. A memory access operation includes both write and read operations. The precharge operation equalizes the voltage level of the bitlines at a known level, to enhance reliability of the data written to a cell and to allow quick detection of data read from a cell. Memory bitlines are typically precharged to equilibrate the dual ended, true/complement differential bitline wires. This method allows a low level (typically 100 mv) signal to be developed with a small memory cell into a large capacitive load bitline. The control signals activating and deactivating the precharge must be margined into the offstate before the wordline turns on and the memory call can drive the bitline. As device feature sizes and voltage levels decrease, this margin is increasingly difficult to obtain while maintaining maximum performance (max frequency minimum clk cycle time) operation.

SUMMARY OF THE INVENTION

The method and apparatus of the present invention overcomes the shortcomings of the prior art by providing a memory system using low impedance memory bitlines that eliminate the need for a precharge clock signal to pull the bitlines back to the power supply $V_{dd}$ level.

A digital processing system in accordance with the present invention comprises a datapath module, a control module, an input-output module and a memory module, wherein the memory module further comprises at least one memory cell having the low impedance memory bitline configuration described hereinbelow. The memory cell is operably connected to first and second bitlines and to a write line. An equilibration circuit controlled by a reference voltage is connected to the first and second bitlines and is operable to maintain a predetermined equilibrium condition between the first and second bit lines. The equilibration circuit is operable to generate an impedance load in the first and second bitlines at a level that allows generation of differential signals in the bitlines.

In one embodiment of the invention, the equilibration circuit comprises first and second pMOS devices in series with the first and second bitlines, respectively, and a third pMOS device connected between the first and second bitlines. The gates of the first, second and third pMOS devices are connected to the reference voltage. In this embodiment, the first, second and third pMOS devices operate as resistors in the linear region of MOSFET device operation. The resistance of the first, second and third pMOS devices is determined by the gate-source voltage of the pMOS devices. The reference voltage is controlled by a reference circuit that is operable to change the reference voltage to compensate for variations in operating characteristics of the first, second and third pMOS devices.

The write line is operably connected to the memory cell by at least one transfer gate, which in one embodiment is an nMOS device. The reference voltage is related to the gate drive current of the transfer gate. The reference circuit of the present invention is also operable to change the reference voltage to compensate for variations in the operating characteristics of the nMOS device comprising the transfer gate.

Using the method and apparatus of the present invention, the memory cell bitlines can move from a sensed state "low" to the opposite state "high" without an intervening precharge, thereby providing a significant increase in performance.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
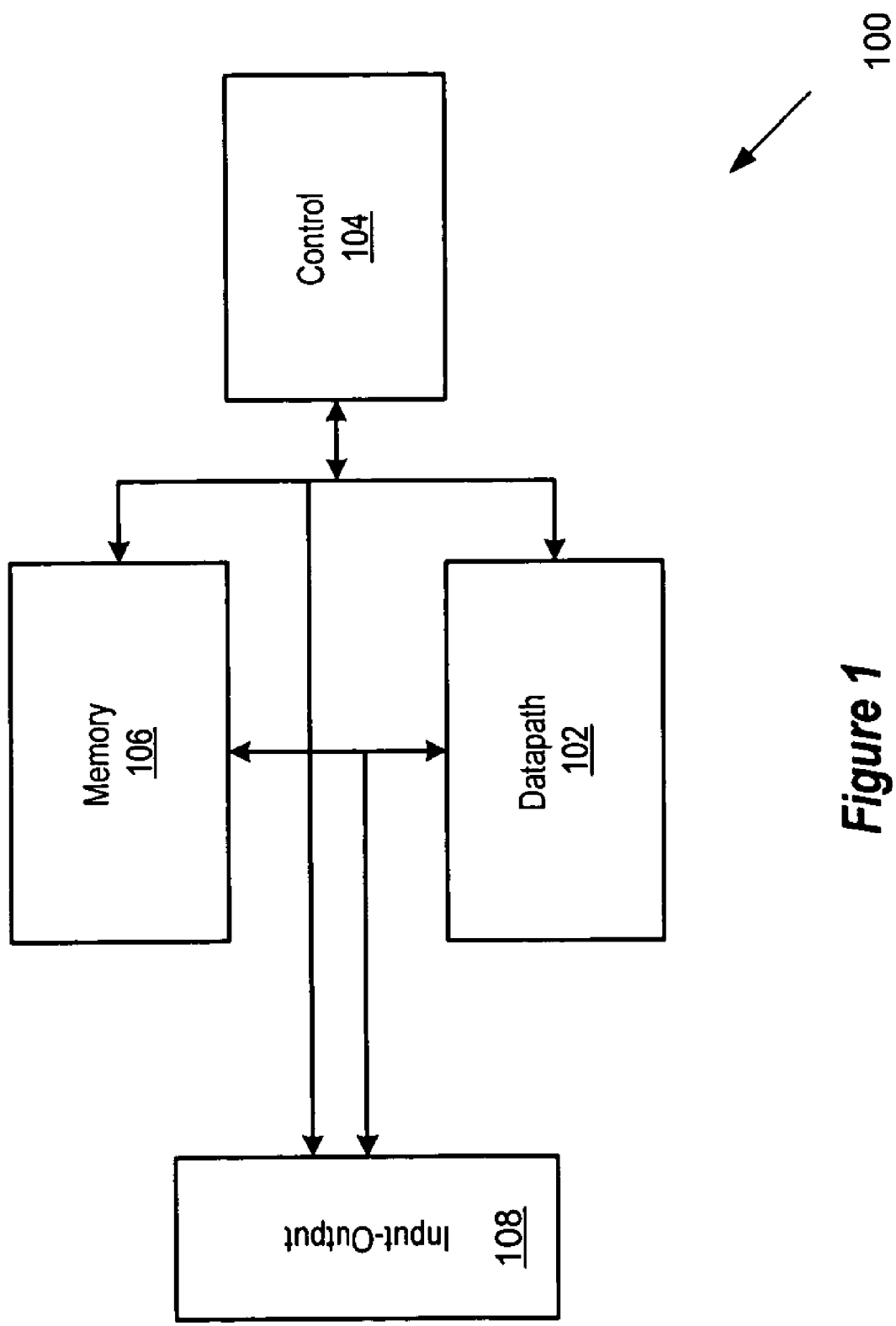
FIG. 1 is an illustration of a digital information processing system comprising the memory module.

FIG. 1 is a block diagram of major modules of a digital processor 100. The datapath module is the core of the processor and is the module in which all of the computations are performed. The other modules illustrated in FIG. 1 support the operation of the datapath 102 by storing the results generated by the datapath 102 or by controlling operations performed in successive cycles. The control module 104 comprises registers and logic that determine the actions that will occur in the processor in any particular cycle. The memory module 106 provides centralized data storage and can be implemented using a wide variety of memory devices, including the memory structures described hereinbelow in connection with the method and apparatus of the present invention. The input/output module 108 serves to connect the various processor modules to each other and also provides a pathway for the exchange of data with devices outside the processor 100.

Figure 2:
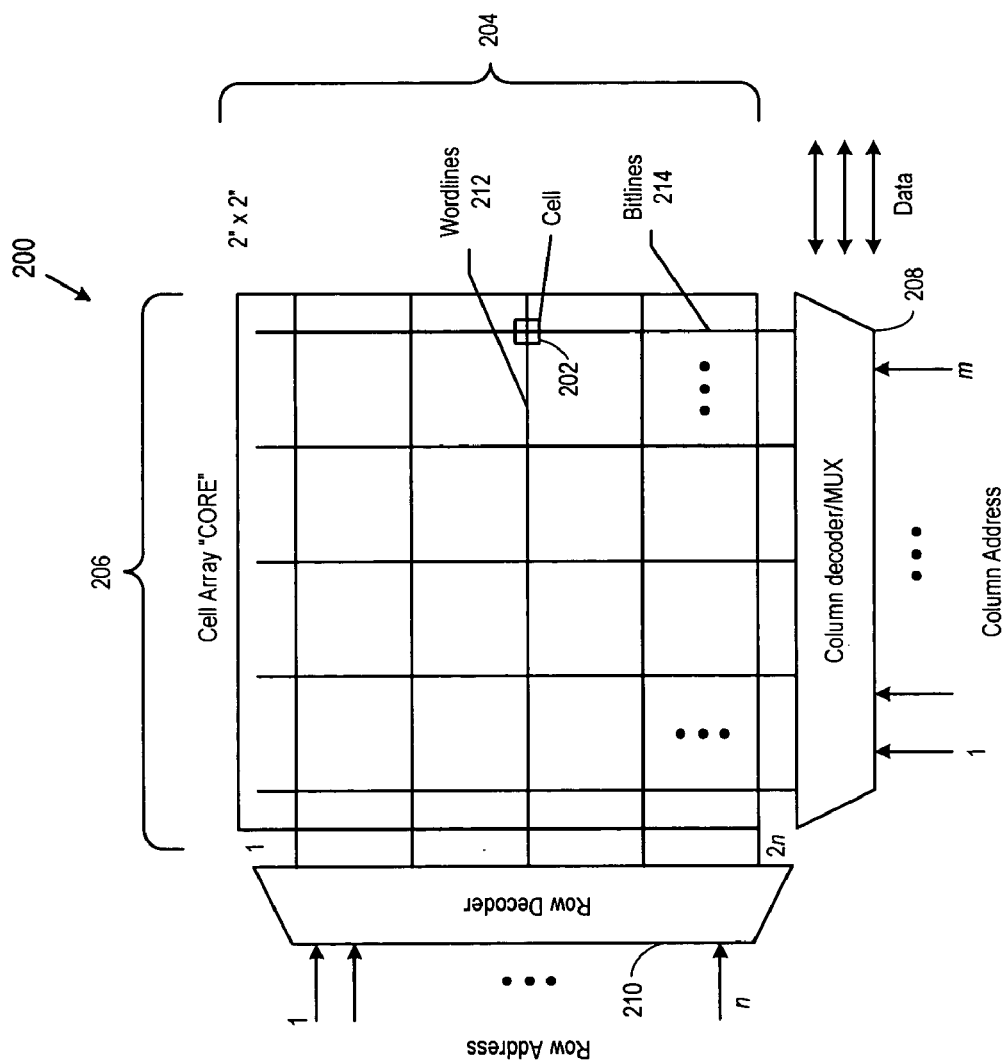
FIG. 2 is an illustration of the functional components of a memory cell array.

FIG. 2 is an illustration of the functional components of a memory cell array 200. The memory cell array or core 200 comprises a plurality of memory cells 202 that are arranged to share connections in horizontal rows 204 and vertical columns 206. Each of the cells 202 can store either a 0 or a 1. A cell 202 can be accessed for purposes of either reading or writing by selecting its row and column. The row and column (or group of columns) to be selected for the purpose of decoding data is determined by decoding binary address information. Column addresses are decoded by column decoder/MUX 208 while row addresses are decoded by row decoder 210. Horizontal wordlines 212 are driven by the row decoder 210 while a plurality of bitlines 214 are driven by the column decoder/MUX 208. Data flows into the memory cells 202 via the bitlines 214.

Figure 3:
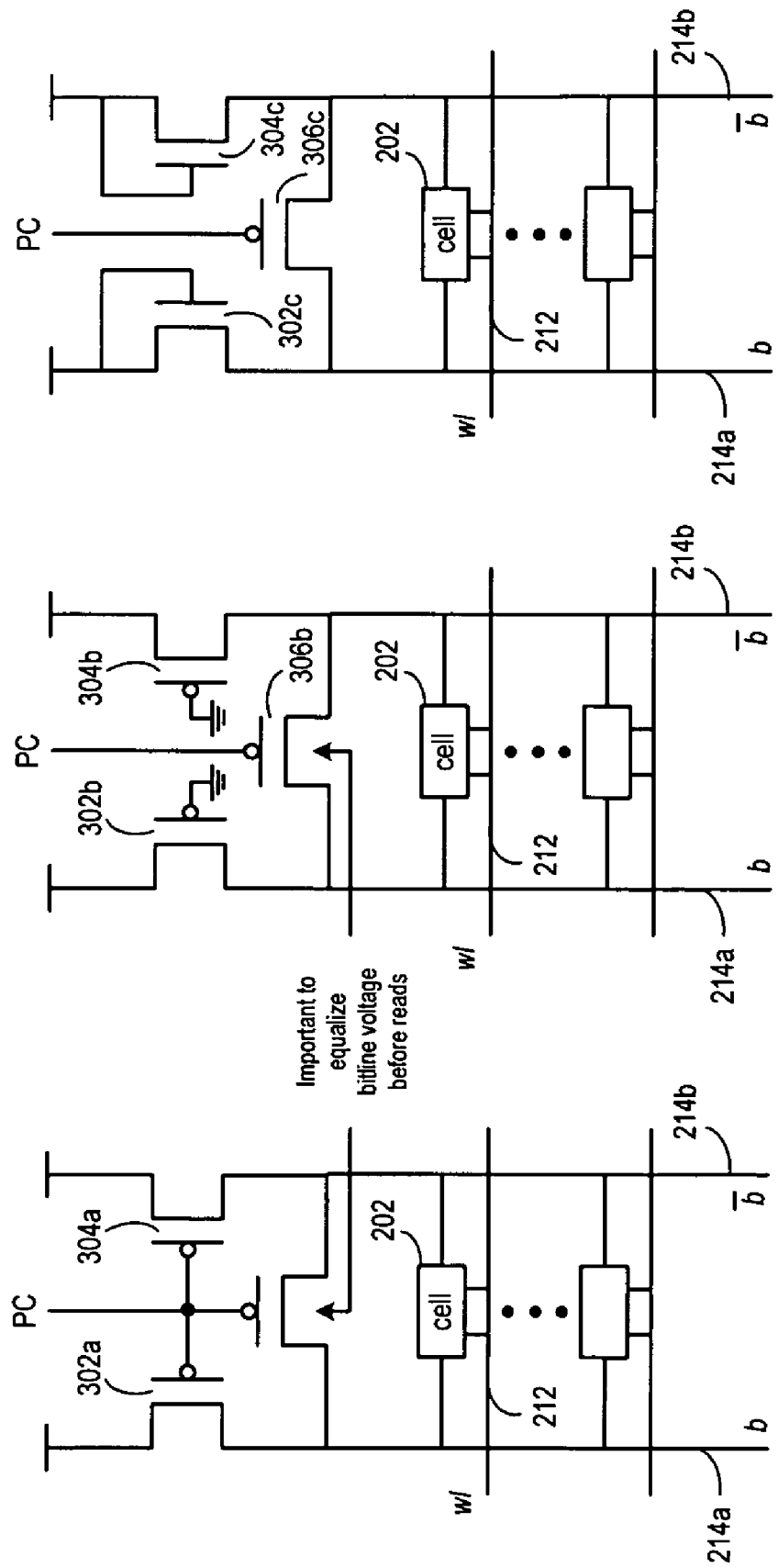
FIG. 3A is an illustration of an embodiment of a prior art implementation for precharging the bitlines for a memory cell.
FIG. 3B is a second embodiment of a prior art implementation for precharging the bitlines of a memory cell.
FIG. 3C is a third embodiment of a prior art implementation for precharging the bitlines of a memory cell.

FIGS. 3A–C illustrate three prior art configurations for precharging the bitlines associated with a memory cell 202. For both read and write operations, the bitlines 214 (shown in FIG. 2) are initially pulled up to a high voltage near cap $V_{dd}$. FIGS. 3A, 3B, and 3C illustrate various embodiments of prior art circuits for "precharging" the bitlines 214. In each of these figures, the bitlines 214 discussed in connection with FIG. 2 are shown to comprise a bitline 214a and a bitline complement 214b illustrated in FIGS. 3A, 3B, and 3C. The precharge signal, PC is a signal whose frequency limits the frequency of read and write operations.

In the embodiment illustrated in FIG. 3A, precharge signal, PC, is applied to two pull-up transistors 302 and 304. The precharge signal, PC, is also applied to a third transistor 306 which serves as the "balance" transistor. The balance transistor 306 is connected between bitlines 214a and 214b to equalize the voltage levels on these bitlines. When the wordline 212 signal goes "high" for a read operation, one bitline remains "high" while the other bitline falls at a linear rate until wordline 212 goes "low." The difference between the bitlines is fed into a voltage sensing latch-based amplifier that is triggered when the differential voltage exceeds a certain threshold.

In the embodiment illustrated in FIG. 3B, two static loads and a balance transistor form the precharge circuit. The static loads are comprised of transistors 302b and 304b. In this prior art embodiment, the precharge signal is applied to the gate of transistor 306b, which equalizes the voltage levels of the two bitlines. Once the bitlines 214a and 214b are precharged, the PC signal is turned off (raised to $V_{dd}$) and, at this point, the wordline 212 can be activated. The pullup devices 302b and 304b are still "on" and, therefore, current will flow through one of them and into the side of the cell with the stored "0." Eventually, a steady-state output level will be reached by the bitline.

In the prior art embodiment illustrated in FIG. 3C, a precharge signal is applied to the balance transistor 306c which equalizes the voltage levels on the bitlines 214a and 214b. Once the bitlines are precharged "high," the precharge signal is turned off (raised to $V_{dd}$) and, then, the wordline 212 goes high. At this point, the pullup devices 302c and 304c are still active. Therefore, current will flow through one of the pullup devices into the cell side with the stored "0." A steady state level output level will then be reached by the corresponding bitline.

Figure 4:
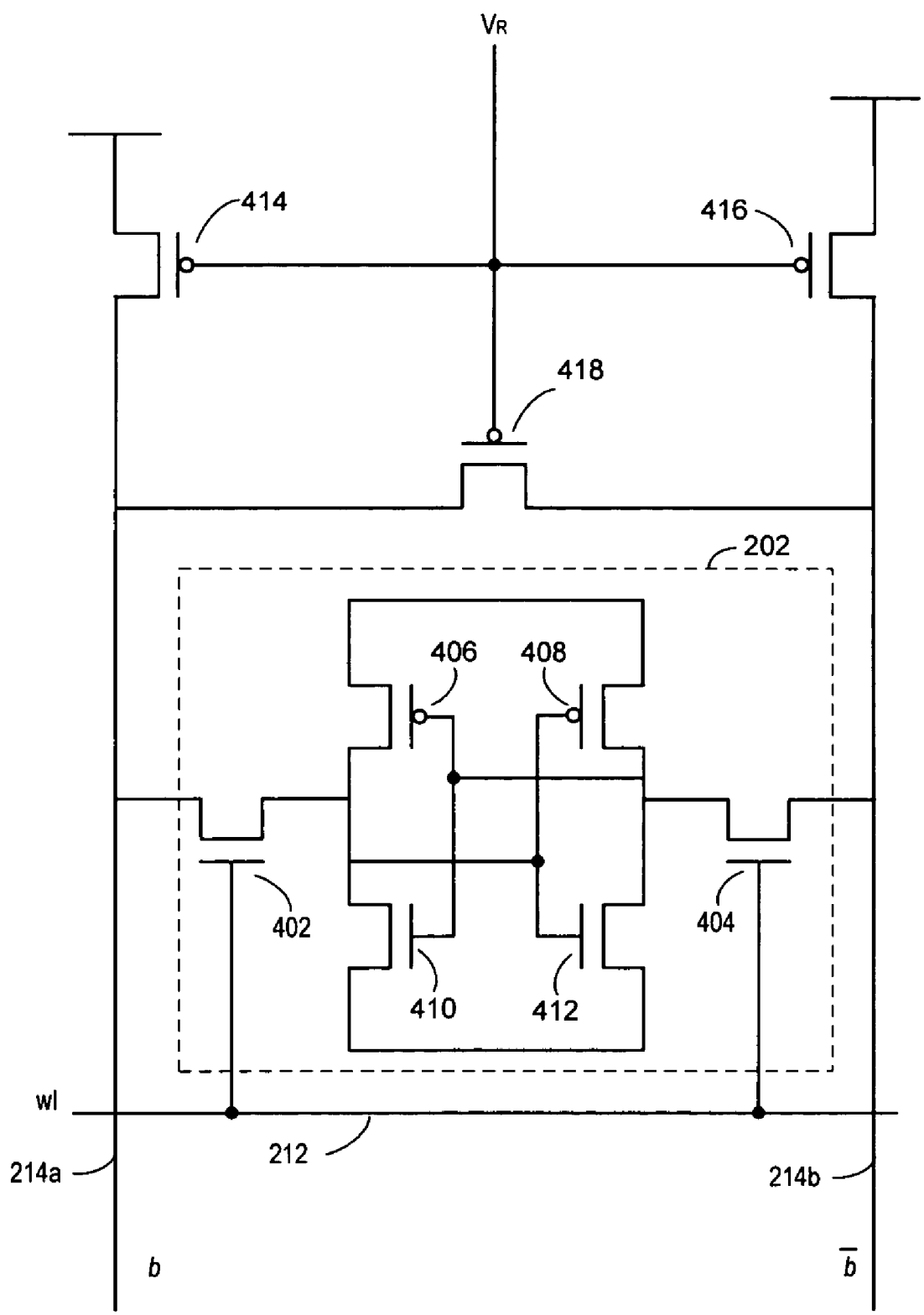
FIG. 4 is an illustration of an embodiment for implementing the method and apparatus of the present invention using low impedance memory bitline eliminating precharge.

FIG. 4 is an illustration of the equilibration network implemented in the method and apparatus of the present invention for controlling the equilibrium condition of bitlines associated with a memory cell 202. The memory cell 202 comprises transfer gates 402 and 404 that are enabled by the write line 212. Information is stored in the memory cell in a transistor network comprising first and second pMOS transistors 406, 408, and n type MOS transistors 410 and 412.

Bitlines 214a and 214b connect peripheral read circuits and write circuits to the memory cell 202. The gate control nodes of the network are driven by a voltage reference input $V_R$. The equilibration network is comprised of load transistors 414 and 416 and a balance transistor 418. Each of the gates of the load transistors 414, 416 and the balance transistor 418 are controlled by a reference voltage $V_R$. As discussed above in connection with the prior art embodiments of FIGS. 3A–C, in prior art systems, an equilibration network connected to the differential bitline pair 214a and 214b is typically switched "off" and driven to $V_{dd}$ by the precharge signal. In the system of the present invention, illustrated in FIG. 4, the gates are driven by a voltage reference ($V_R$) whose level is dependent on the memory cell nMOS transfer gate drive current. In this method, the access of the memory cell proceeds without prior switching transitions of bitlines to $V_{dd}$. In the system of the present invention, the equilibration loads are weak enough to allow differential signal development. The lack of a precharge clock results in elimination of signal race conditions that would require timing margin to prevent malfunction.

In the equilibration network illustrated in FIG. 4, the transistors 414, 416 and 418 are pMOS devices operating as resistors in the linear region of MOFSET device operation. The resistance value is determined by the $V_{gs}$ voltage of the pMOS devices. If $V_R$ is set too low (referenced to $V_{dd}$), then the pMOS equilibration network resistance will be too high, the Vbitmax level will be too large, and after the cell is turned off, the bitline will take too long to return to equilibrium or to the alternate state. If $V_R$ is set too high (referenced to $V_{dd}$), not enough differential voltage across the bitlines will be developed, which can result in sensing the wrong state if excessive sense amplifier offset or noise exists. Thus it is a delicate trade-off in determining the level of $V_R$ which must be maintained. Therefore, in the method and apparatus of the present invention, the voltage reference $V_R$ is designed to track the parameters of the pMOS loads and the average characteristics of the nMOS transfer gate of the memory cell.

Writes can leave the loads connected and on at the $V_R$ level, since they are high impedance relative to the write drivers. Optionally, the $V_R$ signal could be switched in a write cycle using circuit elements not shown, but understood by those of skill in the art. Simulations have shown that acceptable performance is obtained by limiting the maximum excursion of the bitline with preceding data to not fall to $V_{bitmax} < 2*V_{signal\ desired}$ (both referenced to $V_{dd}$) the signal voltage design target for the sense circuits.

Figure 5:
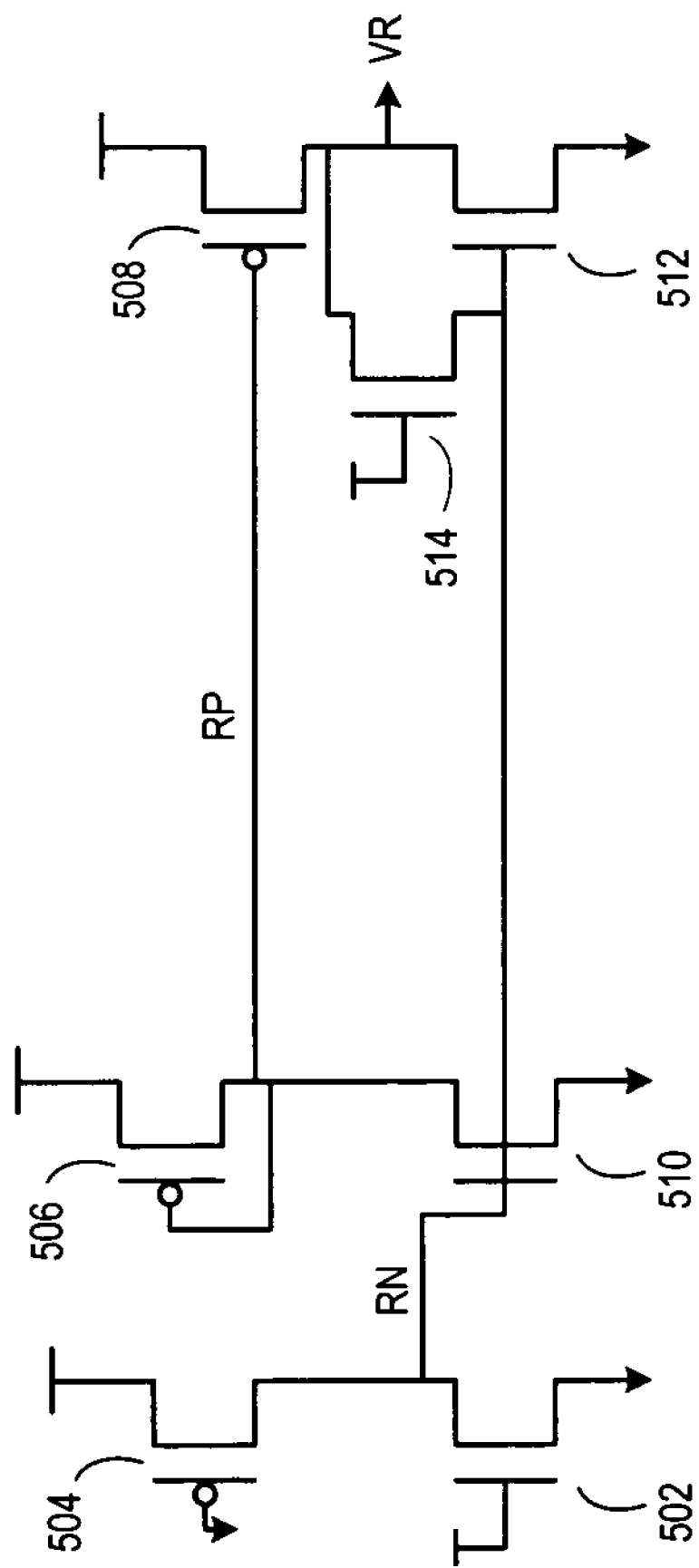
FIG. 5 is an embodiment of an implementation of a voltage reference circuit for use in the method and apparatus of the present invention.

FIG. 5 is an illustration of the circuitry for generating the reference voltage $V_R$. The reference voltage $V_R$ is not a constant level, but varies across process, voltage and temperature (PVT). In the present invention, the circuitry of FIG. 5 is designed to ensure that $V_R$ varies to track the transfer gate parameters that determine the drain-source current of the transfer gates 402 and 404 in the memory cell 202. It produces a mirrored current from the positive $V_{dd}$ rail of approximately the same magnitude as the memory cell current. Since the pMOS load is in the linear region acting as a resistor, the downward swing of the bitline will be limited and will develop approximately two times the desired signal at the limit. The objective is to satisfy the relationship:

(current from memory cell)*$(R_{pmos\ load})$= 2*$V_{signal\ desired}$.

The signal swing thus developed must be carefully limited so that the pMOS devices 414, 416, and 418 have sufficient drive to pull the bitline back up to $V_{dd}$ when the memory cell 202 is turned off, or the next memory cell might impress opposite data on the other bitline. This is achieved by nMOS transistor 502 which tracks the effect of the transfer gate 402 or 404 on the bitline, thereby matching the memory cell transfer gate 402 which is in saturation while delivering constant current at a PVT point. The pMOS transistor 504 emulates the effects of the loads of pMOS transistors 414, 416, and 418 on the bitline when these devices are operated in the linear region. The pMOS transistors 506, 508 and nMOS transistors 510, 512 are configured to provide a current mirror that has sufficient gain to increase the output drive of the reference since it is necessary to drive a multiplicity of bitline loads. The nMOS transistor 514 improves the stability of the circuit. Other embodiments of the circuitry for generation of $V_R$ are possible, as will be understood by those of skill in the art.

OTHER EMBODIMENTS

Other embodiments are within the following claims. The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A memory system, comprising:
    a memory cell;
    first and second bitlines operably connected to said memory cell;
    a write line operably connected to said memory cell; and
    an equilibration circuit controlled by a reference voltage, said equilibrium circuit connected to said first and second bitlines, said equilibrium circuit comprising first and second pMOS devices in series with said first and second bitlines, respectively, and a third pMOS device connected between said first and second bitlines and wherein the gates of said first, second and third pMOS devices are connected to said reference voltage, wherein said first, second and third pMOS devices operate as resistors in the linear region of MOSFET device operation, and wherein said equilibration circuit is operable:
    to maintain a predetermined equilibrium condition between said first and second bit lines; and
    to generate an impedance load in said first and second bit lines at a level that allows generation of differential signals in said bit lines.

2. The memory system according to claim 1, wherein the resistance of said first, second and third pMOS devices is determined by the gate-source voltage of said pMOS devices.

3. The memory system according to claim 2, wherein said write line is operably connected to said memory cell by at least one transfer gate.

4. The memory system according to claim 3, wherein said transfer gate comprises an nMOS device and wherein said reference voltage is related to the gate drive current of said transfer gate.

5. The memory system according to claim 4, wherein said reference voltage is controlled by a reference circuit that is operable to change said reference voltage to compensate for variations in operating characteristics of said first, second and third pMOS devices.

6. The memory system according to claim 5, wherein said reference circuit is further operable to change the reference voltage to compensate for variations in the operating characteristics of said nMOS device comprising said transfer gate.

7. The memory system according to claim 6, wherein said reference circuit comprises a current mirror.

8. A method for controlling operation of a memory system, comprising:
    storing information in a memory cell;
    generating a predetermined equilibrium condition between first and second bitlines operably connected to said memory cell using an equilibration circuit connected to said first and second bitlines, said equilibrium circuit being controlled by a reference voltage and comprising first and second pMOS devices in series with said first and second bitlines, respectively, and a third pMOS device connected between said first and second bitlines, wherein the gates of said first, second and third pMOS devices are connected to said reference voltage and, wherein said first, second and third pMOS devices operate as resistors in the linear region of MOSFET device operation; and
    controlling the content of information in said memory cell with a write line operably connected to said memory cell.

9. The method according to claim 8, wherein the resistance of said first, second and third pMOS devices is determined by the gate-source voltage of said pMOS devices.

10. The method according to claim 9, wherein said write line is operably connected to said memory cell by at least one transfer gate.

11. The method according to claim 10, wherein said transfer gate comprises an nMOS device and wherein said reference voltage is related to the gate drive current of said transfer gate.

12. The method according to claim 11, wherein said reference voltage is controlled by a reference circuit that is operable to change said reference voltage to compensate for variations in operating characteristics of said first, second and third pMOS devices.

13. The method according to claim 12, wherein said reference circuit is further operable to change the reference voltage to compensate for variations in the operating characteristics of said nMOS device comprising said transfer gate.

14. The method according to claim 13, wherein said reference circuit comprises a current mirror.

15. A digital processing system, comprising:
a datapath module;
a control module;
an input-output module; and
a memory cell;
first and second bitlines operably connected to said memory cell;
a write line operably connected to said memory cell; and
an equilibration circuit controlled by a reference voltage, said equilibrium circuit connected to said first and second bitlines, said equilibrium circuit comprising first and second pMOS devices in series with said first and second bitlines, respectively, and a third pMOS device connected between said first and second bitlines and wherein the gates of said first, second and third pMOS devices are connected to said reference voltage, wherein said first, second and third pMOS devices operate as resistors in the linear region of MOSFET device operation, wherein said equilibration circuit is operable:
to maintain a predetermined equilibrium condition between said first and second bit lines; and
to generate an impedance load in said first and second bit lines at a level that allows generation of differential signals in said bit lines.

16. The digital processing system according to claim 15, wherein the resistance of said first, second and third pMOS devices is determined by the gate-source voltage of said pMOS devices.

17. The digital processing system according to claim 16, wherein said write line is operably connected to said memory cell by at least one transfer gate.

18. The digital processing system according to claim 17, wherein said transfer gate comprises an nMOS device and wherein said reference voltage is related to the gate drive current of said transfer gate.

19. The digital processing system according to claim 18, wherein said reference voltage is controlled by a reference circuit that is operable to change said reference voltage to compensate for variations in operating characteristics of said first, second and third pMOS devices.

20. The digital processing system according to claim 19, wherein said reference circuit is further operable to change the reference voltage to compensate for variations in the operating characteristics of said nMOS device comprising said transfer gate.

21. The digital processing system according to claim 20, wherein said reference circuit comprises a current mirror.

* * * * *